United States Patent
Kwon et al.

(10) Patent No.: US 12,034,091 B2
(45) Date of Patent: Jul. 9, 2024

(54) LIGHT DETECTOR, LIGHT DETECTION SYSTEM, LIDAR DEVICE, AND MOVING BODY

(71) Applicant: KABUSHIKI KAISHA TOSHIBA, Tokyo (JP)

(72) Inventors: Honam Kwon, Kawasaki Kanagawa (JP); Kazuhiro Suzuki, Tokyo (JP); Keita Sasaki, Yokohama Kanagawa (JP); Mariko Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 725 days.

(21) Appl. No.: 17/184,297

(22) Filed: Feb. 24, 2021

(65) Prior Publication Data
US 2022/0059710 A1    Feb. 24, 2022

(30) Foreign Application Priority Data
Aug. 20, 2020    (JP) ................. 2020-139457

(51) Int. Cl.
*H01L 31/0232* (2014.01)
*G01S 17/08* (2006.01)
(Continued)

(52) U.S. Cl.
CPC ........ *H01L 31/02327* (2013.01); *G01S 17/08* (2013.01); *G01S 17/89* (2013.01); *H01L 27/1446* (2013.01); *H01L 31/107* (2013.01)

(58) Field of Classification Search
CPC ........... H01L 31/02327; H01L 27/1446; H01L 31/107; H01L 27/14625; H01L 27/1463;
(Continued)

(56) References Cited

U.S. PATENT DOCUMENTS 9,825,083 B2 * 11/2017 Nagano ............. H01L 27/14663
11,598,858 B2 * 3/2023 Kwon ............... H01L 31/02005
(Continued)

FOREIGN PATENT DOCUMENTS

CN    111092138 A    5/2020
JP    2003-229553 A    8/2003
(Continued)

OTHER PUBLICATIONS

China National Intellectual Property Administration, Notice of Completing Formalities for Patent Registration Notice Of Granting Patent Right for Invention, and Search Report in CN 202110211234. 0, 4 pages, and translation, 4 pages (May 8, 2024).
(Continued)

*Primary Examiner* — Seung C Sohn
(74) *Attorney, Agent, or Firm* — Finnegan, Henderson, Farabow, Garrett & Dunner, LLP

(57) ABSTRACT

According to one embodiment, a light detector includes a first semiconductor layer of a first conductivity type, a first region, a quenching part, a second region, and a first layer. The first region is located on a portion of the first semiconductor layer, includes a first-conductivity-type first semiconductor region that has a higher first-conductivity-type impurity concentration than the first semiconductor layer, and includes a second semiconductor region of a second conductivity type provided on the first semiconductor region. The quenching part is electrically connected to the second semiconductor region. The second region is located on another portion of the first semiconductor layer, includes a second-conductivity-type third semiconductor region, and includes a first-conductivity-type fourth semiconductor region provided on a portion of the third semiconductor region. The first layer is located on the second region and includes a resin that absorbs or reflects light.

21 Claims, 11 Drawing Sheets

(51) Int. Cl.
*G01S 17/89* (2020.01)
*H01L 27/144* (2006.01)
*H01L 31/107* (2006.01)

(58) Field of Classification Search
CPC ......... H01L 27/14609; H01L 27/14623; H01L 27/1443; H01L 31/02161; H01L 31/0352; G01S 17/08; G01S 17/89; G01S 7/4863; G01S 17/86
See application file for complete search history.

(56) References Cited

U.S. PATENT DOCUMENTS

| | | |
|---|---|---|
| 2003/0168679 A1 | 9/2003 | Nakai et al. |
| 2007/0114362 A1 | 5/2007 | Feng et al. |
| 2008/0038001 A1 | 2/2008 | Becker et al. |
| 2014/0158899 A1 | 6/2014 | Sugiyama et al. |
| 2014/0263975 A1 | 9/2014 | Nagano et al. |
| 2014/0291487 A1 | 10/2014 | Laforce |
| 2015/0084149 A1 | 3/2015 | Yagi et al. |
| 2015/0140577 A1 | 5/2015 | Li et al. |
| 2017/0031010 A1 | 2/2017 | Suzuki et al. |
| 2017/0315122 A1 | 11/2017 | Li et al. |
| 2018/0033895 A1 | 2/2018 | Mazzillo et al. |
| 2018/0269236 A1 | 9/2018 | Sasaki |
| 2019/0088812 A1 | 3/2019 | Nobusa et al. |
| 2019/0157479 A1 | 5/2019 | Nobusa et al. |
| 2019/0277703 A1 | 9/2019 | Valouch et al. |
| 2019/0280145 A1 | 9/2019 | Natsuaki et al. |
| 2019/0326345 A1 | 10/2019 | Yamamoto et al. |
| 2020/0025934 A1 | 1/2020 | Kwon et al. |
| 2020/0127167 A1 | 4/2020 | Lee et al. |
| 2020/0213542 A1 | 7/2020 | Ikeda |
| 2021/0028202 A1 | 1/2021 | Inoue et al. |
| 2021/0132230 A1 | 5/2021 | Fujiwara et al. |

FOREIGN PATENT DOCUMENTS

| | | |
|---|---|---|
| JP | 2009-517662 A | 4/2009 |
| JP | 2009-526489 A | 7/2009 |
| JP | 2012-122950 A | 6/2012 |
| JP | 2014-116429 A | 6/2014 |
| JP | 2014-192895 A | 10/2014 |
| JP | 2015-61041 A | 3/2015 |
| JP | 5832852 B2 | 12/2015 |
| JP | 2017-33962 A | 2/2017 |
| JP | 2018-156984 A | 10/2018 |
| JP | 2019-54246 A | 4/2019 |
| JP | 2019-527839 A | 10/2019 |
| JP | 2019-532517 A | 11/2019 |
| JP | 2020-13950 A | 1/2020 |
| JP | 2020-73889 A | 5/2020 |
| JP | 2020-107980 A | 7/2020 |
| JP | 2021-72347 A | 5/2021 |
| WO | WO 2019/189700 A1 | 10/2019 |

OTHER PUBLICATIONS

Fabio Acerbi et al, "NUV Silicon Photomultipliers with High Detection Efficiency and Reduced Delayed Correlated-Noise," IEEE Trans. on Nuclear Science, vol. 62, No. 3, pp. 1318-1325, XP011584314, ISSN:0018-9499, DOI:10.1109/TNS.2015.2424676 (2015).
European Patent Office, Communication pursuant to Article 94(3) EPC in EP 21157843.0, 7 Pages (Apr. 30, 2024).

\* cited by examiner

LIGHT DETECTOR, LIGHT DETECTION SYSTEM, LIDAR DEVICE, AND MOVING BODY

CROSS-REFERENCE TO RELATED APPLICATIONS

This application is based upon and claims the benefit of priority from Japanese Patent Application No. 2020-139457, filed on Aug. 20, 2020; the entire contents of which are incorporated herein by reference.

FIELD

Embodiments described herein relate generally to a light detector, a light detection system, a lidar device, and a moving body.

BACKGROUND

There is a light detector that detects light incident on a semiconductor region. It is desirable to increase the reliability of the light detector.

DETAILED DESCRIPTION

Figure 1:
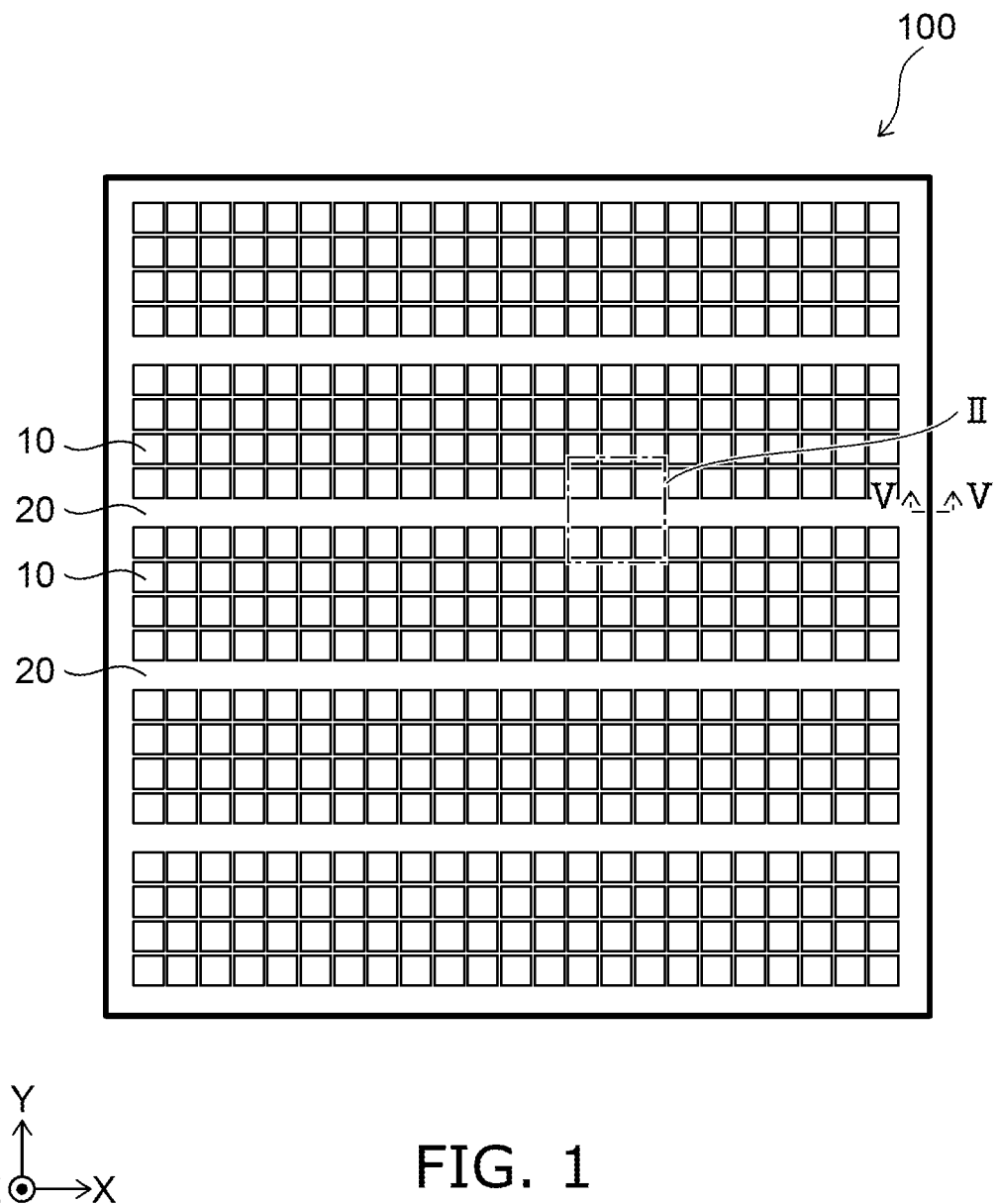
FIG. 1 is a schematic plan view illustrating a light detector according to a first embodiment.

According to one embodiment, a light detector includes a first semiconductor layer of a first conductivity type, a first region, a quenching part, a second region, and a first layer. The first region is provided on a portion of the first semiconductor layer. The first region includes a first semiconductor region of the first conductivity type having a higher first-conductivity-type impurity concentration than the first semiconductor layer, and a second semiconductor region provided on the first semiconductor region. The second semiconductor region is of a second conductivity type. The quenching part is electrically connected to the second semiconductor region. The second region is provided on another portion of the first semiconductor layer. The second region includes a third semiconductor region of the second conductivity type, and a fourth semiconductor region provided on a portion of the third semiconductor region. The fourth semiconductor region is of the first conductivity type. The first layer is provided on the second region. The first layer includes a resin that absorbs or reflects light.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic plan view illustrating a light detector according to a first embodiment.

Figure 2:
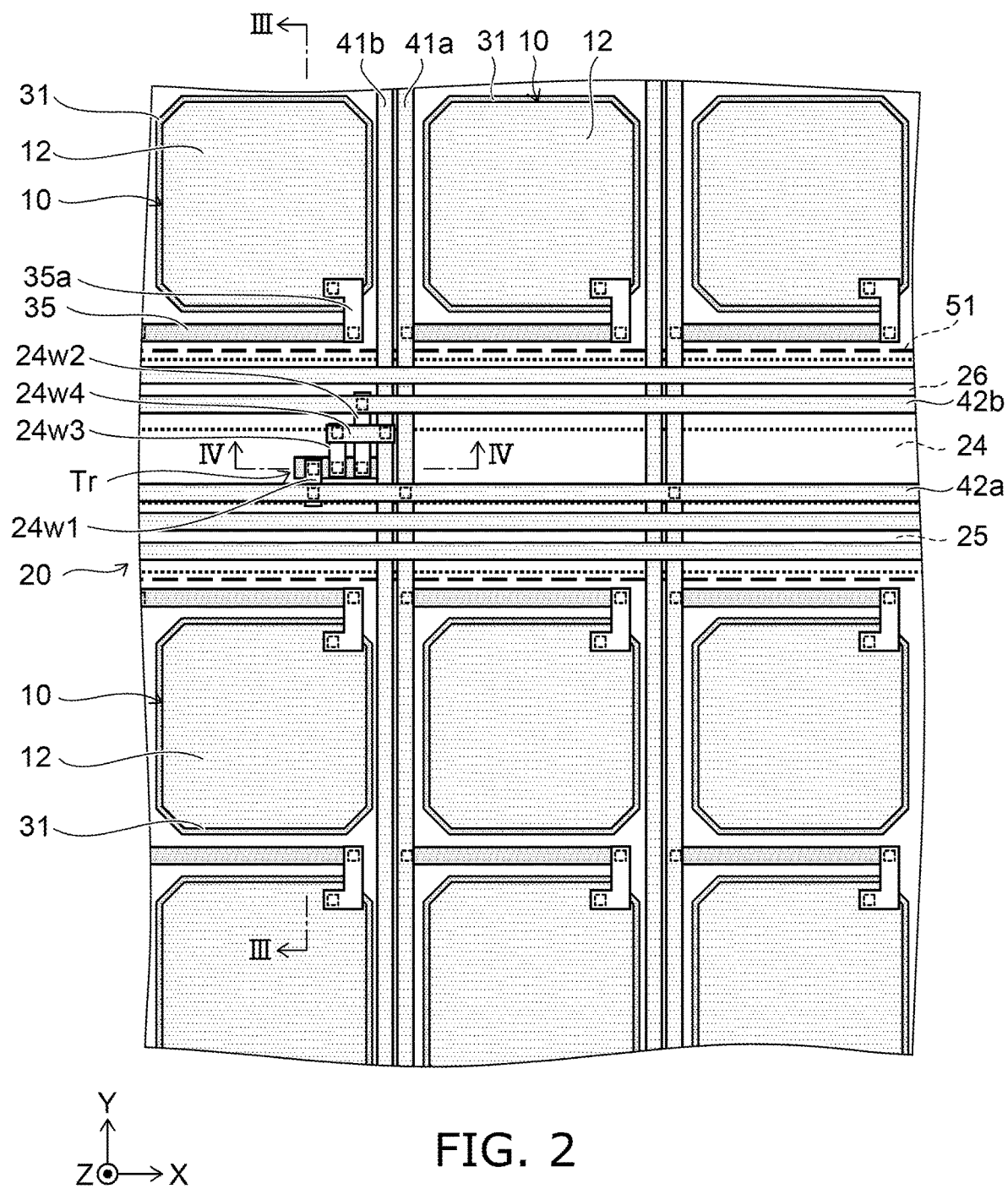
FIG. 2 is an enlarged plan view of portion II of FIG. 1.
Figure 3:
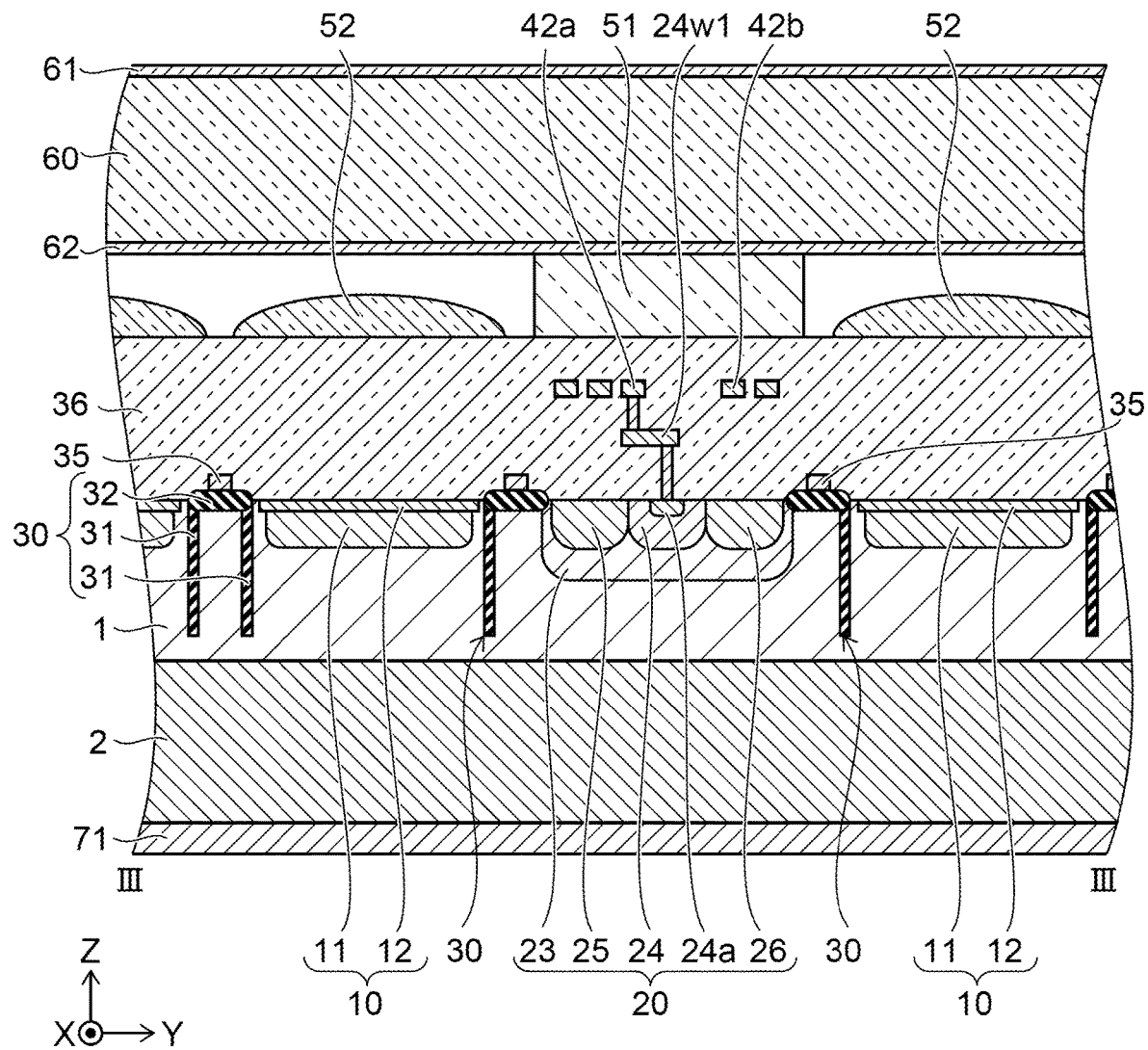
FIG. 3 is a III-III cross-sectional view of FIG. 2.
Figure 4:
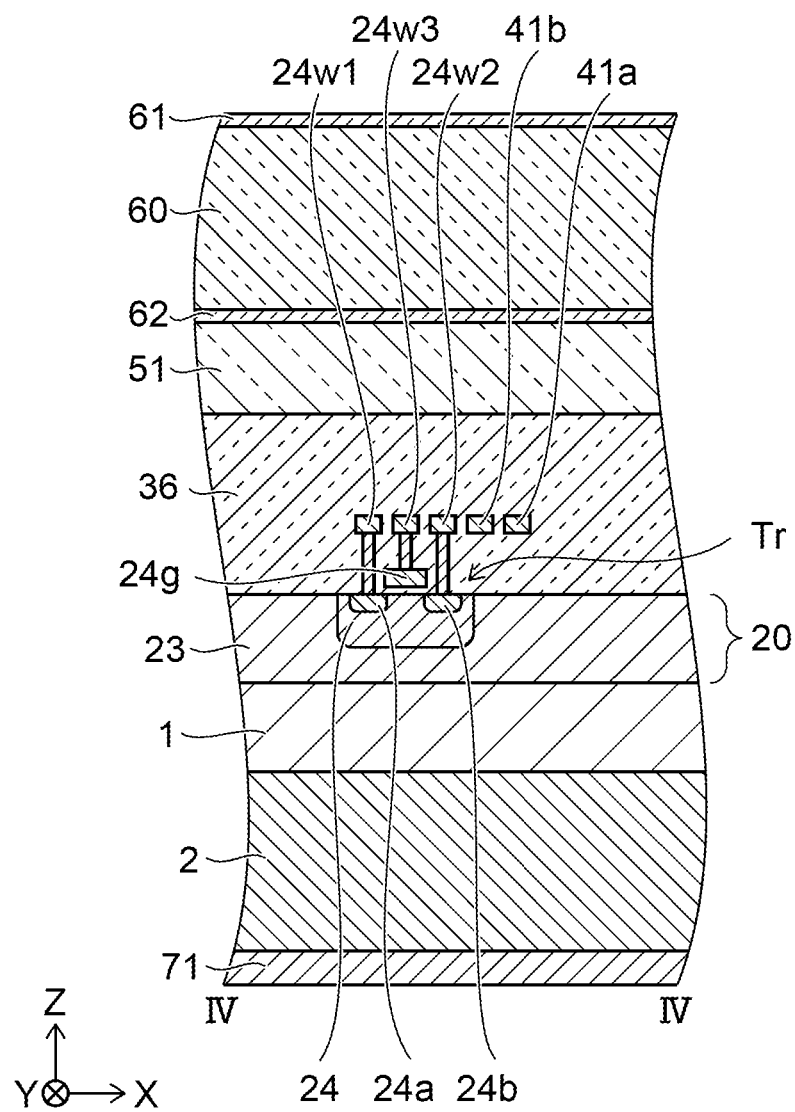
FIG. 4 is a IV-IV cross-sectional view of FIG. 2.
Figure 5:
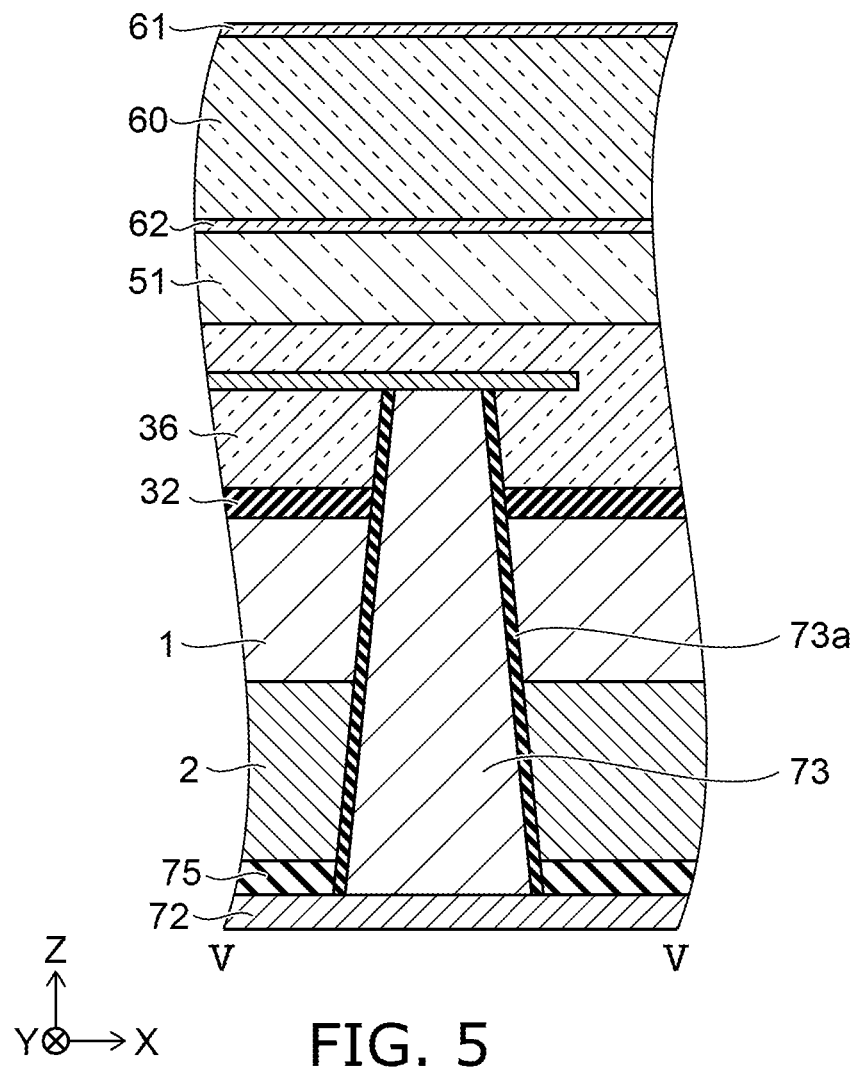
FIG. 5 is a V-V cross-sectional view of FIG. 1.

FIG. 2 is an enlarged plan view of portion II of FIG. 1. FIG. 3 is a III-III cross-sectional view of FIG. 2. FIG. 4 is a IV-IV cross-sectional view of FIG. 2. FIG. 5 is a V-V cross-sectional view of FIG. 1.

As shown in FIGS. 1 to 5, the light detector 100 according to the first embodiment includes a first semiconductor layer 1, a second semiconductor layer 2, a first region 10, a second region 20, an insulating region 30, a quenching part 35, an insulating layer 36, a first layer 51, a lens 52, a first member 60, a first filter layer 61, a second filter layer 62, a first electrode 71, a second electrode 72, and a conductive part 73.

As illustrated in FIG. 3, the first region 10 is located on a portion of the first semiconductor layer 1 of a first conductivity type. The first region 10 includes a first semiconductor region 11 of the first conductivity type and a second semiconductor region 12 of a second conductivity type. The second semiconductor region 12 is located on the first semiconductor region 11. The first conductivity type is one of a p-type or an n-type. The second conductivity type is the other of the p-type or the n-type. In the description hereinbelow, the first conductivity type is the p-type, and the second conductivity type is the n-type.

Here, the direction from the first semiconductor region 11 toward the second semiconductor region 12 is taken as a Z-direction (a first direction). Two mutually-orthogonal directions perpendicular to the Z-direction are taken as an X-direction (a second direction) and a Y-direction (a third direction). In the description, the direction from the first semiconductor region 11 toward the second semiconductor region 12 is called "up", and the reverse direction is called "down". These directions are based on the relative positional relationship between the first semiconductor region 11 and the second semiconductor region 12 and are independent of the direction of gravity.

The p-type impurity concentration in the first semiconductor region 11 is greater than the p-type impurity concentration in the first semiconductor layer 1. The n-type impurity concentration in the second semiconductor region 12 is greater than the p-type impurity concentration in the first semiconductor layer 1. A p-n junction surface is formed between the first semiconductor region 11 and the second semiconductor region 12. For example, the p-n junction surface is parallel to the X-direction and the Y-direction. For example, the first region 10 functions as an avalanche photodiode.

The second region 20 is located on another portion of the first semiconductor layer 1. The second region 20 includes a third semiconductor region 23 of the n-type. For example, the third semiconductor region 23 extends deeper than the second semiconductor region 12. In other words, the lower end of the third semiconductor region 23 is positioned lower than the lower end of the second semiconductor region 12.

Any circuit element is provided on the second region 20. A semiconductor region that is included in at least a portion of the circuit element is provided on the third semiconductor region 23. For example, as shown in FIG. 3, the second region 20 includes a fourth semiconductor region 24 of the p-type, a semiconductor region 25 of the n-type, and a semiconductor region 26 of the n-type. The fourth semiconductor region 24, the semiconductor region 25, and the semiconductor region 26 are located on the third semiconductor region 23. The fourth semiconductor region 24 is located between the semiconductor regions 25 and 26 in the Y-direction. The n-type impurity concentrations in the semiconductor regions 25 and 26 are greater than the n-type impurity concentration in the third semiconductor region 23.

A voltage is applied in the reverse direction between the first semiconductor region 11 and the second semiconductor region 12. The voltage is applied to the first semiconductor region 11 via the first semiconductor layer 1. By providing the third semiconductor region 23 of the n-type that is the opposite conductivity type of the first semiconductor layer 1, the effects of the potential of the first semiconductor layer 1 on the potentials of the fourth semiconductor region 24, the semiconductor region 25, and the semiconductor region 26 can be reduced. For example, by setting the third semiconductor region 23 to extend deeper than the second semiconductor region 12, the fourth semiconductor region 24, the semiconductor region 25, and the semiconductor region 26 can be stably electrically isolated from the first semiconductor layer 1. The operation of the circuit element provided on the third semiconductor region 23 can be stabilized thereby.

For example, as shown in FIG. 4, the second region 20 further includes semiconductor regions 24a and 24b of the n-type. The semiconductor regions 24a and 24b are located on the fourth semiconductor region 24. For example, the n-type impurity concentrations in the semiconductor regions 24a and 24b are greater than the p-type impurity concentration in the fourth semiconductor region 24. A portion of the fourth semiconductor region 24 is located between the semiconductor regions 24a and 24b in the X-direction. An electrode 24g is provided on the portion of the fourth semiconductor region 24 with an insulating layer interposed. The semiconductor region 24a, the semiconductor region 24b, and the electrode 24g are included in a field effect transistor Tr.

The type of the circuit element, the number of the circuit elements, the number of interconnects, etc., provided on the second region 20 are arbitrary. Transistors may be provided on the semiconductor regions 25 and 26 as well. Other than transistors, circuit elements such as capacitors, diodes, etc., may be provided on the fourth semiconductor region 24, the semiconductor region 25, and the semiconductor region 26.

Multiple first regions 10 are arranged in the X-direction and the Y-direction. In the example shown in FIGS. 1 and 2, the second region 20 extends in the X-direction between the first regions 10 adjacent to each other in the Y-direction. The transistors of the second region 20 are used as control elements for selecting the photodiodes. In other words, the light detector 100 has a mixed-circuit-type structure that includes a cell array part in which multiple cells (first regions 10 or photodiodes) are arranged in the X-direction and the Y-direction, and a control circuit part (the second region 20) that includes control elements.

The insulating region 30 is provided around the first region 10 and around the second region 20 in the X-direction and the Y-direction. The insulating region 30 includes, for example, a first insulating region 31 and a second insulating region 32. The first insulating region 31 is provided around the first region 10 in the X-direction and the Y-direction. The second insulating region 32 is positioned on at least a portion of the first insulating region and is provided along the upper surface of the first semiconductor layer 1.

The multiple first insulating regions 31 are provided respectively around the multiple first regions 10. One second insulating region 32 is positioned on the multiple first insulating regions 31 and is provided around each of the first regions 10.

The multiple first insulating regions 31 are separated from each other. A portion of the first semiconductor layer 1 is located between the adjacent first insulating regions 31. The p-type impurity concentration in the portion of the first semiconductor layer 1 may be the same as or different from the p-type impurity concentration in the other portions of the first semiconductor layer 1.

The insulating region 30 may include only one of the first insulating region 31 or the second insulating region 32. When the insulating region 30 includes both the first insulating region 31 and the second insulating region 32, the insulative properties between the first regions 10 and the insulative properties between the first region 10 and the second region 20 can be improved.

The quenching part 35 is positioned higher than the second semiconductor region 12 and is electrically connected to the second semiconductor region 12. The quenching part 35 is located on the insulating region 30. For example, as shown in FIG. 2, the quenching part 35 is electrically connected to the second semiconductor region 12 via an interconnect 35a and a contact plug extending in the Z-direction. The electrical resistance of the quenching part 35 is greater than the electrical resistances of the contact plug and the interconnect 35a. It is favorable for the electrical resistance of the quenching part 35 to be not less than 50 kΩ and not more than 2 MΩ.

The quenching part 35 is provided to suppress the continuation of the avalanche breakdown that occurs when light enters the first region 10. A voltage drop that corresponds to the electrical resistance of the quenching part 35 occurs when avalanche breakdown occurs and a current flows in the quenching part 35. The potential difference between the first semiconductor region 11 and the second semiconductor region 12 is reduced by the voltage drop; and the avalanche breakdown stops. The next light that is incident on the first region 10 can be detected thereby.

As described above, a resistor that generates a large voltage drop may be provided as the quenching part 35; instead of a resistor, a control circuit that blocks the current may be provided as the quenching part 35. For example, the control circuit includes a comparator, a control logic part, and two switching elements. A known configuration called an active quenching circuit is applicable to the control circuit. For example, the active quenching circuit is provided in the second region 20. The active quenching circuit may be provided outside the light detector 100.

For example, the reverse voltage that is greater than the breakdown voltage is applied between the first semiconductor region 11 and the second semiconductor region 12; and the first region 10 operates in a Geiger mode. By operating in the Geiger mode, a pulse signal that has a high gain and a short time constant is output.

In the example shown in FIGS. 2 and 4, the semiconductor region 24a is electrically connected to an interconnect 42a via a contact plug and an interconnect 24w1. The interconnect 42a is electrically connected to an interconnect 41a via a contact plug. In other words, the semiconductor region 24a is electrically connected to at least one second semiconductor region 12. The semiconductor region 24b is electrically connected to an interconnect 42b via a contact plug and an interconnect 24w2. The electrode 24g is electrically connected to an interconnect 41b via a contact plug, an interconnect 24w3, and an interconnect 24w4.

For example, multiple transistors are provided on the second region 20. By applying a voltage to one of the multiple interconnects 41b, one of the multiple transistors provided in the second region 20 is selected. By selecting the one transistor, at least a portion of the multiple first regions 10 is electrically connected with the interconnect 42b. The voltage is applied between the first semiconductor region 11 and the second semiconductor region 12 in the at least a portion of the multiple first regions 10. The charge that is generated by the incident light flows toward the interconnect 42b via the selected transistor.

The insulating layer 36 is light-transmissive and is provided on the first region 10, the second region 20, and the insulating region 30. The interconnects, the plugs, etc., described above are provided in the insulating layer 36. The insulating layer 36 may include multiple insulating films.

As shown in FIG. 3, the first layer 51 is located on the second region 20. The first layer 51 includes a resin that absorbs or reflects light. For example, the third semiconductor region 23 overlaps the first layer 51 when viewed from the Z-direction.

The lens 52 is located on the first region 10. The lens 52 is light-transmissive. The upper surface of the lens 52 is curved in a convex shape so that the light that is incident on the lens 52 from above converges toward the first region 10. For example, the lens 52 is a microlens. The multiple lenses 52 are located respectively on the multiple first regions 10. The bottom surface of each lens 52 is substantially rectangular or circular when viewed from the Z-direction. Or, the lens 52 may be a lenticular lens. One lens 52 that extends in one direction may be provided on the multiple first regions 10 that are arranged in the one direction. One lens 52 that includes multiple surfaces curved in convex shapes in the upper surface of the one lens 52 may be provided on the multiple first regions 10.

Or, the first layer 51 may be located on a portion of the second region 20; and the lens 52 may be located on another portion of the second region 20.

The first member 60 is located on the first layer 51 and the lens 52. The first member 60 is light-transmissive. The first filter layer 61 is located on the first member 60. The first filter layer 61 is positioned on the first layer 51 and the lens 52. The second filter layer 62 is located between the first layer 51 and the first member 60 and between the lens 52 and the first member 60. The thickness in the Z-direction of the first member 60 is greater than the thicknesses in the Z-direction of the first layer 51, the first filter layer 61, and the second filter layer 62.

For example, as shown in FIG. 3, the first semiconductor layer 1 is located on the second semiconductor layer 2. The p-type impurity concentration in the second semiconductor layer 2 is greater than the p-type impurity concentration in the first semiconductor layer 1. The second semiconductor layer 2 is located on the first electrode 71. The first semiconductor region 11 is electrically connected to the first electrode 71 via the first semiconductor layer 1 and the second semiconductor layer 2.

The conductive part 73 is surrounded with the first and second semiconductor layers 1 and 2 with an insulating layer 73a interposed in the X-direction and the Y-direction. The conductive part 73 is separated from the first and second regions 10 and 20. The conductive part 73 extends through the first and second semiconductor layers 1 and 2 in the Z-direction. The conductive part 73 is provided at any position of the light detector 100. In the example shown in FIGS. 1 and 5, the conductive part 73 is provided in a portion of the outer perimeter of the light detector 100. Multiple conductive parts 73 may be provided along the outer perimeter of the light detector 100.

One end of the conductive part 73 is electrically connected to one interconnect provided above the second region 20. For example, the conductive part 73 is electrically connected to the first region 10 via a transistor. The second electrode 72 is located under the conductive part 73. The other end of the conductive part 73 is electrically connected to the second electrode 72. The second electrode 72 is separated from the first electrode 71. An insulating layer 75 is provided between the second electrode 72 and the second semiconductor layer 2. The second electrode 72 is electrically isolated from the second semiconductor layer 2 and the first electrode 71 by the insulating layers 73a and 75.

The voltage between the first semiconductor region 11 and the second semiconductor region 12 is applied by controlling the potentials of the first and second electrodes 71 and 72 in a state in which the second electrode 72 and the second semiconductor region 12 are electrically connected by selecting the transistor. Thereby, for example, the first region 10 can be caused to operate in the Geiger mode.

Examples of materials of the components will now be described.

The first semiconductor layer 1, the second semiconductor layer 2, and the semiconductor regions include at least one semiconductor material selected from the group consisting of silicon, silicon carbide, gallium arsenide, and gallium nitride. Phosphorus, arsenic, or antimony is used as the n-type impurity when the first semiconductor layer 1 and the semiconductor regions include silicon. Boron is used as the p-type impurity.

For example, the second semiconductor layer 2 is at least a portion of a semiconductor substrate. The first semiconductor layer 1 is a layer that is epitaxially grown on the second semiconductor layer 2. The semiconductor regions are formed by ion implantation into the second semiconductor layer 2.

The insulating region 30, the insulating layer 36, and the insulating layer 73a include silicon and one selected from the group consisting of oxygen and nitrogen. For example, the first insulating region 31, the second insulating region 32, the insulating layer 36, and the insulating layer 73a include silicon oxide. The quenching part 35 that is used as the resistor includes polysilicon as a semiconductor material. An n-type impurity or a p-type impurity may be added to the quenching part 35. The contact plugs and the interconnects include a metal. For example, the contact plugs and the interconnects include at least one selected from the group consisting of titanium, tungsten, copper, and aluminum.

The first layer 51 includes a resin that absorbs or reflects light. For example, the first layer 51 includes an infrared-cutting agent (an IR absorber) and absorbs infrared light. The first layer 51 is provided as a light-absorbing layer. The lens 52 includes a light-transmissive inorganic material or organic material. The first member 60 is a glass substrate or a sapphire substrate. The first filter layer 61 and the second filter layer 62 absorb light of a wavelength in a prescribed range. The materials of the first and second filter layers 61 and 62 can be selected as appropriate according to the absorbed wavelength. For example, the first filter layer 61 and the second filter layer 62 include at least one selected from the group consisting of aluminum, silver, gold, magnesium fluoride ($MgF_2$), lanthanum fluoride ($LaF_3$), tetrahydrofuran ($ThF_3$ or $ThF_4$), silicon oxide ($SiO_2$), titanium oxide ($TiO_2$), zirconium oxide ($ZrO_2$), aluminum oxide ($Al_2O_3$), magnesium oxide ($SiO_2$), germanium, and zinc selenide (ZnSe).

For example, the transmittances of the first and second filter layers 61 and 62 for light of a wavelength in a first range are greater than the transmittances of the first and second filter layers 61 and 62 for light of a wavelength in a second range. The transmittance of the first layer 51 for light of a wavelength in the first range is less than the transmittance of the first layer 51 for light of a wavelength in the second range. The light that passes through the first and second filter layers 61 and 62 is absorbed or reflected by the first layer 51. The amount of the light incident on the second region 20 can be effectively reduced thereby.

For example, the first range is greater than 850 nm and less than 1100 nm. The second range is greater than 400 nm and less than 650 nm. The transmittances of the first and second filter layers 61 and 62 for light of a wavelength in the first range are greater than 10 times the transmittances of the first and second filter layers 61 and 62 for light of a wavelength in the second range. The transmittance of the first layer 51 for light of a wavelength in the second range is greater than 10 times the transmittance of the first layer 51 for light of a wavelength in the first range. The transmittances of the first and second filter layers 61 and 62 for the light of the first wavelength are not less than 10 times the transmittance of the first layer 51 for the light of the first wavelength.

Or, the first layer 51 may include a metal. The reflectance of the first layer 51 can be increased thereby, and the amount of the light incident on the second region 20 can be effectively reduced. For example, the first layer 51 includes at least one selected from the group consisting of copper and aluminum. A layer that includes a metal and a layer that includes a resin may be stacked in the first layer 51. The layer that includes the resin is located on the layer that includes the metal.

The first electrode 71, the second electrode 72, and the conductive part 73 include a metal. The first electrode 71, the second electrode 72, and the conductive part 73 include, for example, at least one selected from the group consisting of aluminum, copper, titanium, gold, and nickel.

FIGS. 6A to 8B are schematic cross-sectional views illustrating manufacturing processes of the light detector according to the first embodiment.

In each of FIGS. 6A to 8B, the drawing on the left side illustrates the manufacturing process in a III-III cross section shown in FIG. 2. In each, the drawing on the right side illustrates the manufacturing process in a V-V cross section shown in FIG. 1.

Figure 6A:
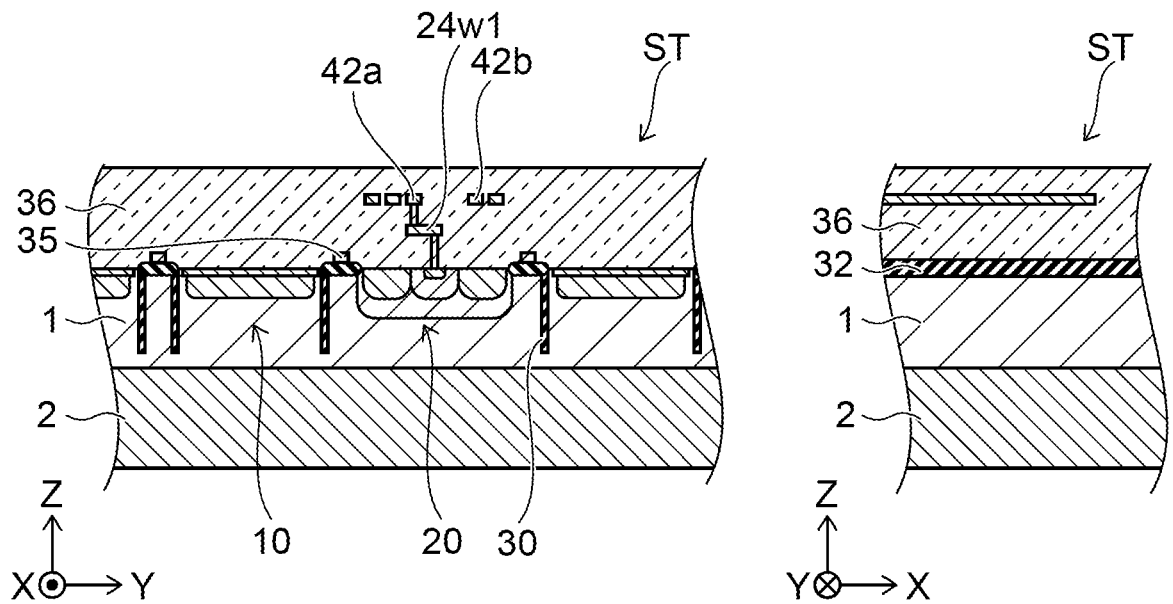
FIGS. 6A and 6B are schematic cross-sectional views illustrating manufacturing processes of the light detector according to the first embodiment.

As shown in FIG. 6A, a structure body ST is prepared in which the first semiconductor layer 1, the second semiconductor layer 2, the first region 10, the second region 20, the insulating region 30, the quenching part 35, the insulating layer 36, the contact plugs, and the interconnects are formed. The structure body ST is manufactured by a known manufacturing method.

Figure 6B:
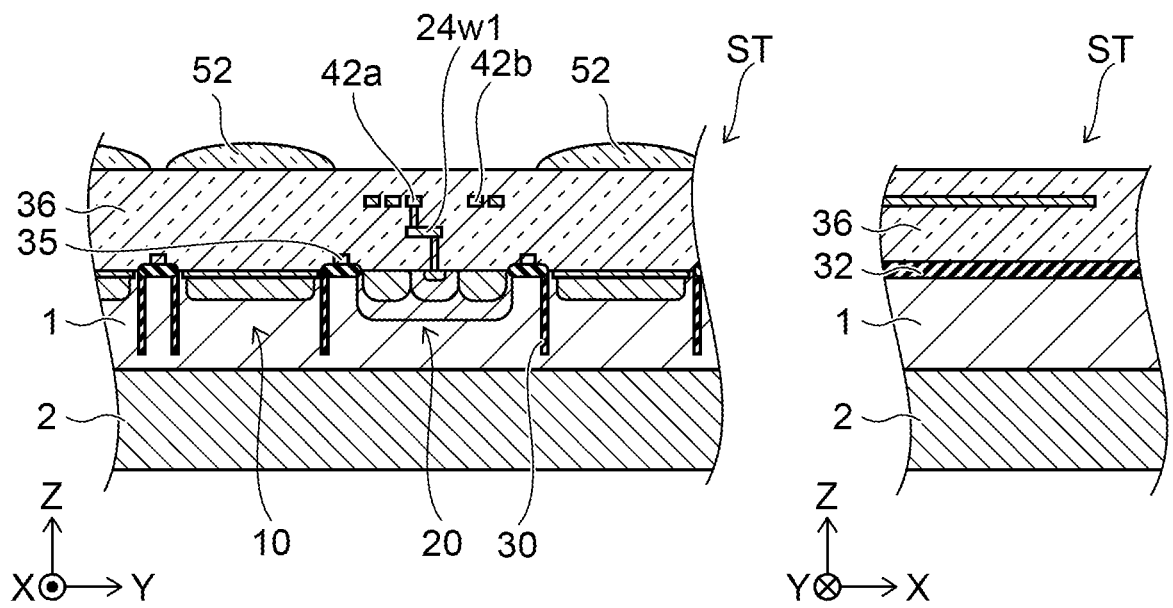
Figure 7A:
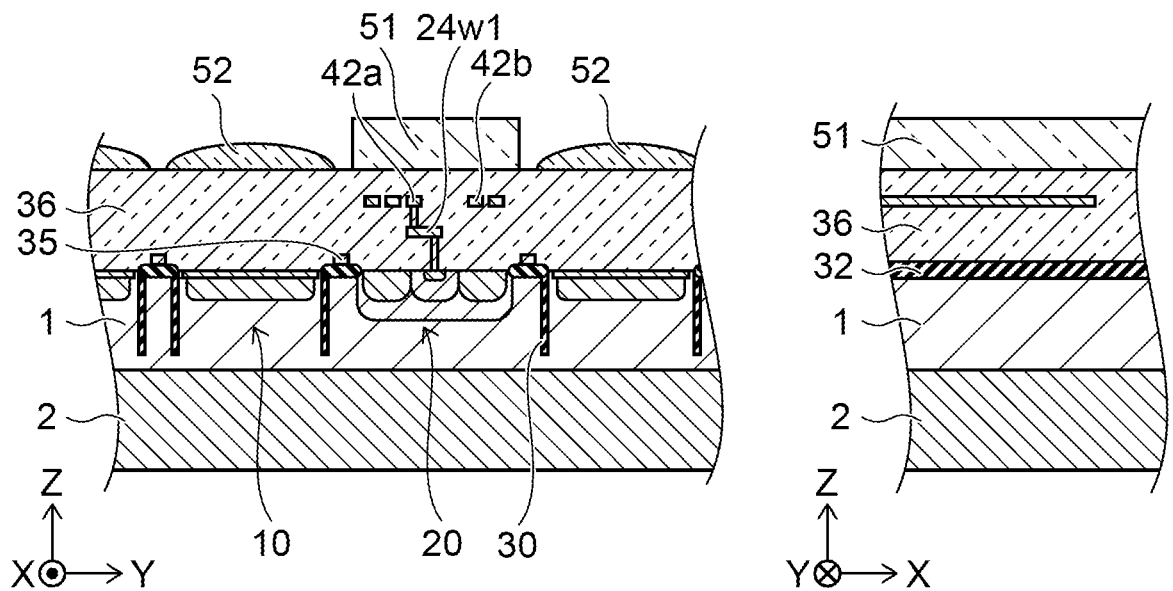
FIGS. 7A and 7B are schematic cross-sectional views illustrating manufacturing processes of the light detector according to the first embodiment.

As shown in FIG. 6B, the lens 52 is formed on a portion of the insulating layer 36. The lens 52 is positioned on the first region 10. As shown in FIG. 7A, the first layer 51 is formed as an adhesive on another portion of the insulating layer 36. The first layer 51 is positioned on the second region 20. The first layer 51 is formed at a position other than the position at which the lens 52 is located.

Figure 7B:
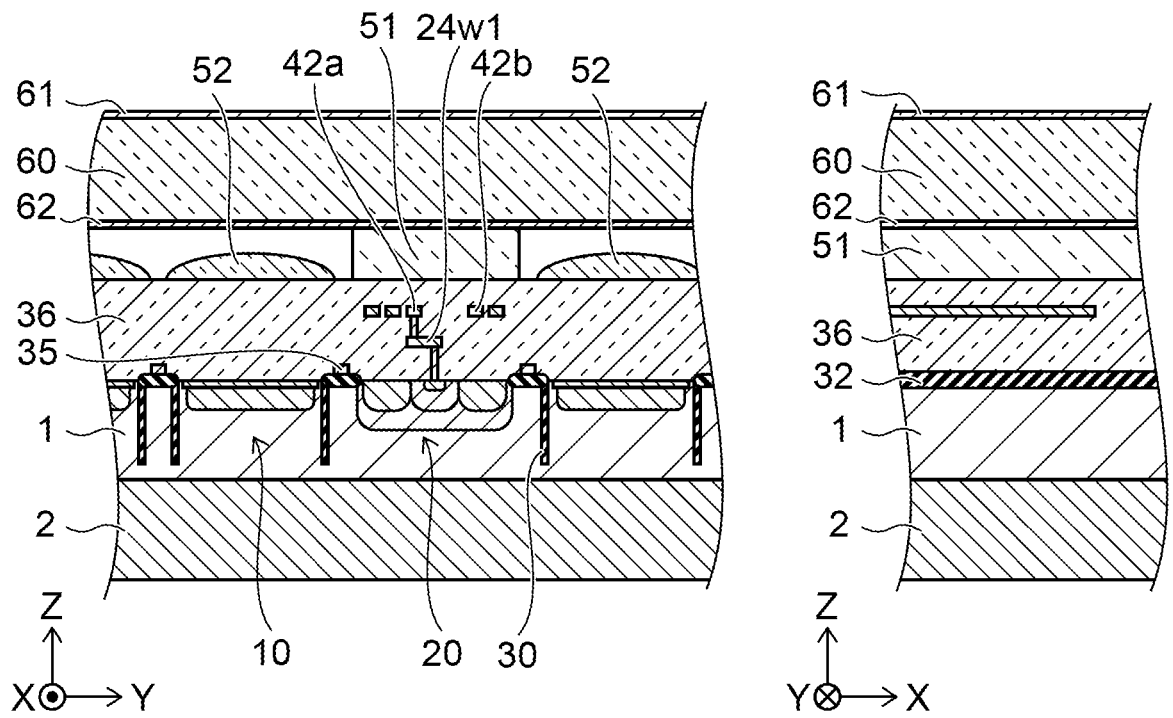

The first member 60 that includes the first filter layer 61 and the second filter layer 62 is prepared. The first filter layer 61 and the second filter layer 62 are located respectively at the upper surface and the lower surface of the first member 60. As shown in FIG. 7B, the first member 60 is bonded to the structure body ST via the first layer 51. The strength of the structure body ST is increased by bonding the first member 60. Also, the handling of the structure body ST is made easy.

Figure 8A:
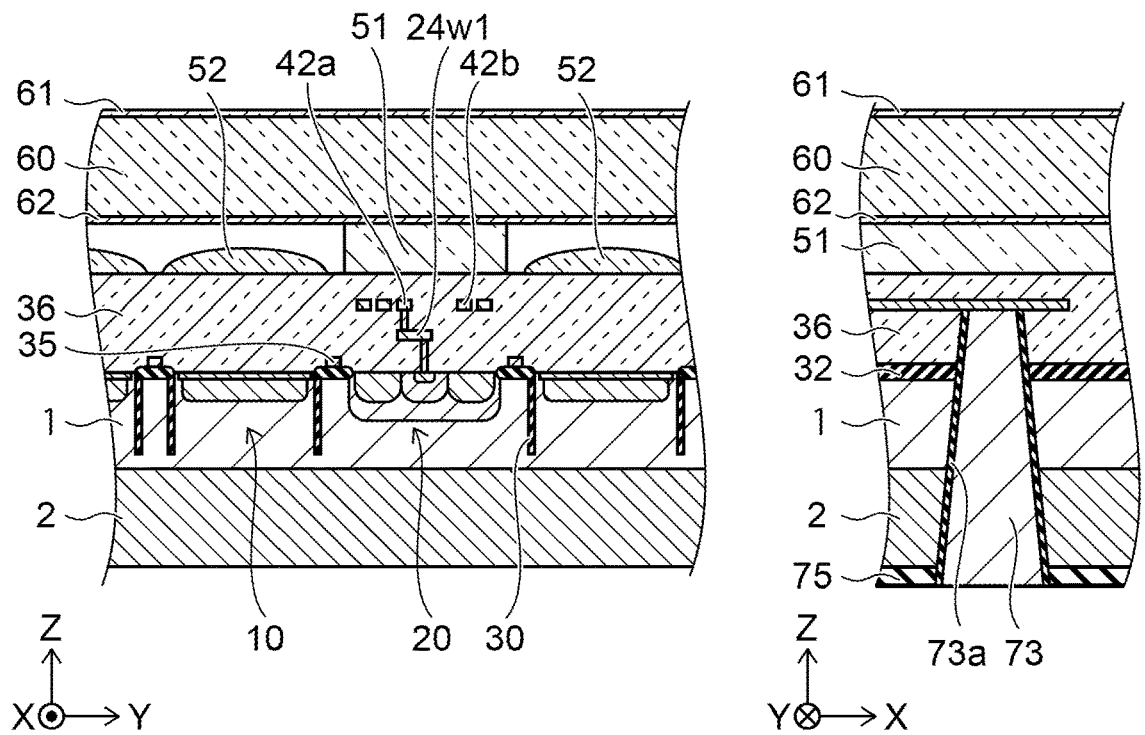
FIGS. 8A and 8B are schematic cross-sectional views illustrating manufacturing processes of the light detector according to the first embodiment.

The insulating layer 75 is partially formed under the second semiconductor layer 2. An opening is formed in the back surface of the structure body ST by removing a portion of the first semiconductor layer 1, a portion of the second semiconductor layer 2, a portion of the second insulating region 32, a portion of the insulating layer 36, and a portion of the insulating layer 75. The thickness of the second semiconductor layer 2 may be reduced before forming the insulating layer 75 and the opening. The opening is easily formed thereby. An interconnect that is provided in the structure body ST is exposed via the opening. The number and shapes of the openings are arbitrary. The insulating layer 73a is formed along the sidewall of the opening. As shown in FIG. 8A, the conductive part 73 that fills the opening is formed on the insulating layer 73a.

Figure 8B:
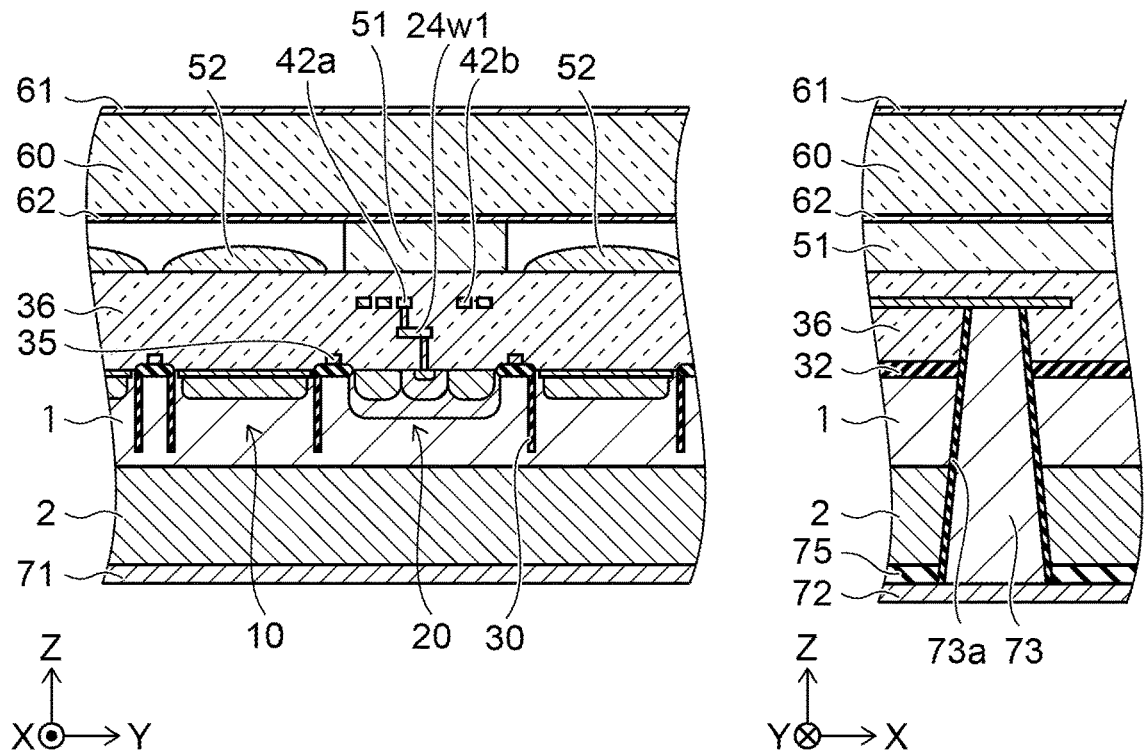

As shown in FIG. 8B, the first electrode 71 and the second electrode 72 are formed respectively under the second semiconductor layer 2 and under the conductive part 73. The light detector 100 according to the first embodiment is manufactured by the processes described above.

Effects according to the first embodiment will now be described.

The light detector 100 according to the first embodiment includes the first region 10 and the second region 20. The first region 10 includes the first semiconductor region 11 and the second semiconductor region 12 that are included in the photodiode. The second region 20 includes the third semiconductor region 23 and the fourth semiconductor region 24. A circuit element that is electrically connected to the first region 10 is provided in the second region 20. The first region 10 and the second region 20 are located on the first semiconductor layer 1. The performance of the light detector 100 can be improved by providing the first region 10 and the second region 20 on the same first semiconductor layer 1. For example, the lengths of the interconnects that connect the first region 10 and the second region 20 can be reduced, and the SN ratio can be improved. The light detector 100 further includes the first layer 51.

The first layer 51 includes a resin that absorbs or reflects light. Or, the first layer 51 includes a metal. The first layer 51 is located on the second region 20. By providing the first layer 51 on the second region 20, the light amount incident on the second region 20 can be reduced. Misoperations of the circuit elements provided in the second region 20 can be suppressed thereby. The reliability of the light detector 100 can be increased.

The light detector 100 also includes the first filter layer 61 and the second filter layer 62. These filter layers absorb or reflect light and are located on the second region 20. By providing the first filter layer 61 and the second filter layer 62 on the second region 20, the light amount incident on the second region 20 can be reduced.

The light detector 100 may include only one of the first layer 51, the first filter layer 61, or the second filter layer 62. The light amount that is incident on the second region 20 can be reduced by providing the one of the first layer 51, the first filter layer 61, or the second filter layer 62 on the second region 20.

Favorably, the light detector 100 includes at least one of the first layer 51, the first filter layer 61, or the second filter layer 62. The light amount incident on the second region 20 can be greatly reduced thereby.

Only one of the first filter layer 61 or the second filter layer 62 may be provided. Favorably, the light detector 100 includes both the first filter layer 61 and the second filter layer 62. By providing both the first filter layer 61 and the second filter layer 62, the stress difference that is generated above and below the first member 60 can be reduced. The warp of the first member 60 can be reduced thereby. For example, the warp of the light detector 100 can be reduced. The occurrence of cracks, etc., in the light detector 100 can be suppressed, and the reliability of the light detector 100 can be increased.

It is favorable for the first filter layer 61 and the second filter layer 62 to be provided on the first region 10 as well. By providing the first filter layer 61 and the second filter layer 62, mainly the light of the wavelength in the first range can be caused to be incident on the first region 10. The sensitivity of the light detector 100 for the light of the wavelength in the first range can be increased thereby.

For example, as shown in FIG. 2, a portion of the second region 20 is located between the first regions 10 in the Y-direction. A portion of the first layer 51 overlaps the portion of the second region 20 when viewed from the Z-direction. It is favorable for the length in the Y-direction of the portion of the first layer 51 to be greater than the length in the Y-direction of the portion of the second region 20. The light amount incident on the second region 20 can be effectively reduced thereby.

Favorably, the first layer 51 and the entire second region 20 overlap when viewed from the Z-direction. The light amount incident on the second region 20 can be further reduced thereby.

The light detector 100 includes the lens 52. The light that is incident on the light detector 100 can be caused to converge toward the first region 10 by the lens 52. The sensitivity of the light detector 100 can be increased thereby.

The light detector 100 includes the conductive part 73. Because the conductive part 73 is provided, it is unnecessary to provide an electrode, a bonding wire, etc., above the first region 10 and the second region 20. The shielding by the electrode, the bonding wire, etc., of light that would be incident on the first region 10 can be suppressed thereby. The sensitivity of the light detector 100 can be increased.

By providing the first member 60, the strength of the structure body that includes the first semiconductor layer 1, the first region 10, the second region 20, etc., can be increased when forming the conductive part 73. The damage of the structure body when forming the conductive part 73 can be suppressed thereby, and the yield of the light detector 100 can be increased.

Second Embodiment

Figure 9:
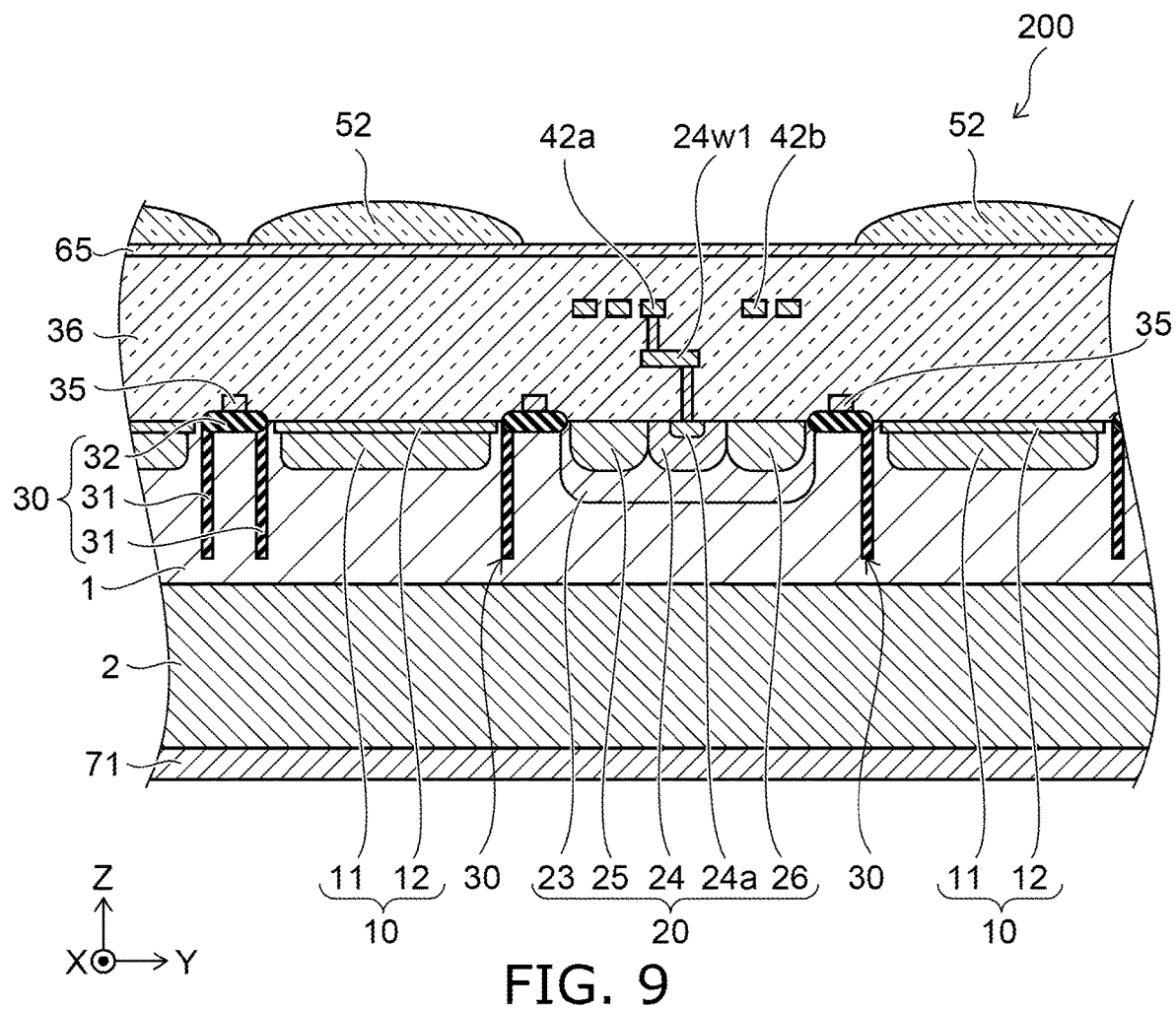
FIG. 9 is a schematic cross-sectional view illustrating a portion of a light detector according to a second embodiment.

FIG. 9 is a schematic cross-sectional view illustrating a portion of a light detector according to a second embodiment.

Compared to the light detector 100, the light detector 200 according to the second embodiment shown in FIG. 9 does not include the first layer 51 and the first member 60. The light detector 200 includes a filter layer 65 instead of the first and second filter layers 61 and 62.

The filter layer 65 is located on the insulating layer 36. The filter layer 65 is located on the first and second regions 10 and 20 and absorbs or reflects light. The lens 52 is located on the filter layer 65. For example, the transmittance of the filter layer 65 for light of a wavelength in the first range is greater than the transmittance of the filter layer 65 for light of a wavelength in the second range.

According to the second embodiment, similarly to the first embodiment, the filter layer 65 that absorbs or reflects light is provided on the second region 20. By providing the filter layer 65, the light amount incident on the second region 20 can be reduced. The misoperations of the circuit elements provided in the second region 20 can be suppressed thereby, and the reliability of the light detector 100 can be increased.

Third Embodiment

Figure 10:
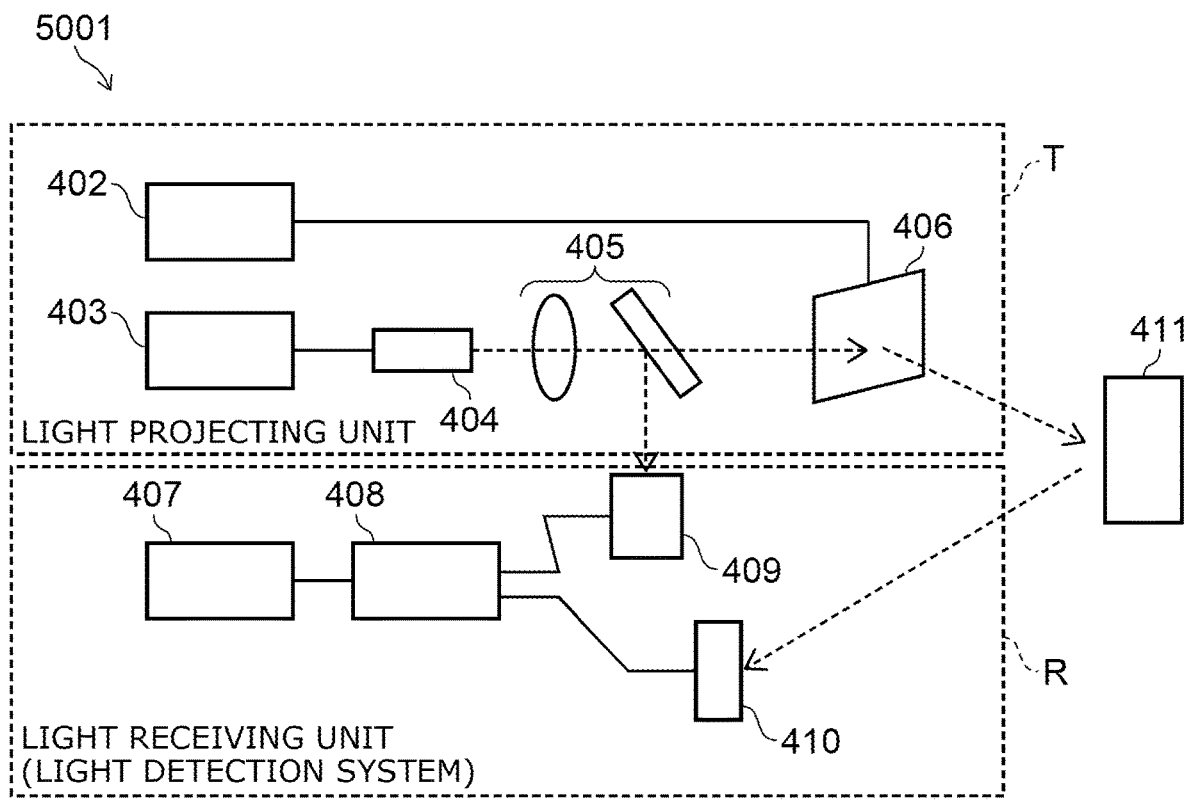
FIG. 10 is a schematic view illustrating a lidar (Laser Imaging Detection and Ranging (LIDAR)) device according to a third embodiment.

FIG. 10 is a schematic view illustrating a lidar (Laser Imaging Detection and Ranging (LIDAR)) device according to a third embodiment.

The embodiment is applicable to a long-distance subject detection system (LIDAR) or the like including a line light source and a lens. The lidar device 5001 includes a light projecting unit T projecting laser light toward an object 411, and a light receiving unit R (also called a light detection system) receiving the laser light from the object 411, measuring the time of the round trip of the laser light to and from the object 411, and converting the time into a distance.

In the light projecting unit T, a laser light oscillator (also called a light source) 404 produces laser light. A drive circuit 403 drives the laser light oscillator 404. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the measurement results of the distance measuring circuit 408.

The lidar device 5001 employs light time-of-flight ranging (Time of Flight) in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band that is invisible to humans. For example, the lidar device 5001 can be used for obstacle detection in a moving body.

Figure 11:
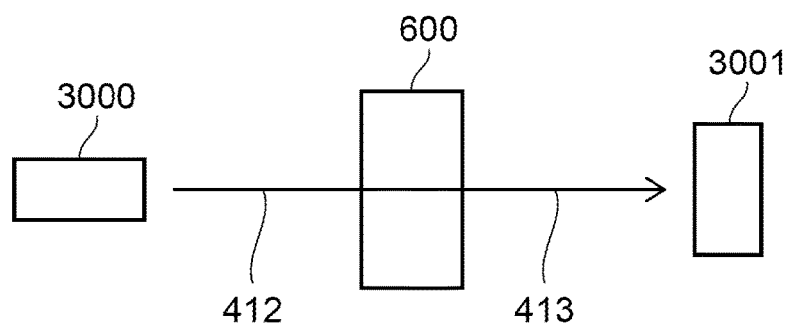
FIG. 11 is a drawing for describing the detection of the detection object of the lidar device.

FIG. 11 is a drawing for describing the detection of the detection object of the lidar device.

A light source 3000 emits light 412 toward an object 600 that is the detection object. A light detector 3001 detects light 413 that passes through the object 600, is reflected by the object 600, or is diffused by the object 600.

For example, the light detector 3001 can realize highly-sensitive detection when the light detector according to the embodiment described above is used. It is favorable to provide multiple sets of the light detector 410 and the light source 404 and to preset the arrangement relationship in the software (which is replaceable with a circuit). For example, it is favorable for the arrangement relationship of the sets of the light detector 410 and the light source 404 to be provided at uniform spacing. Thereby, an accurate three-dimensional image can be generated by the output signals of each light detector 410 complementing each other.

Figure 12:
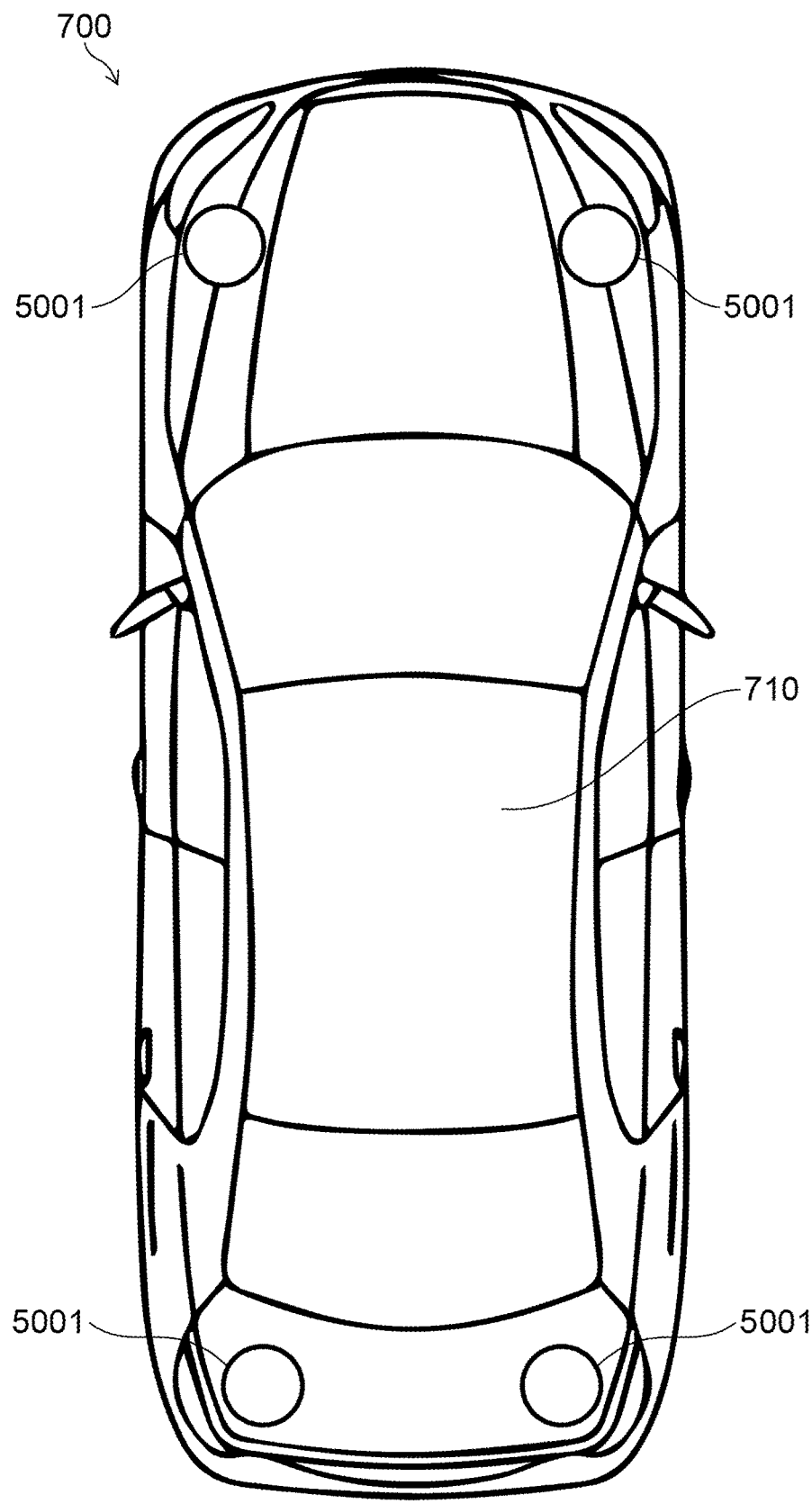
FIG. 12 is a schematic top view of a moving body including the lidar device according to the third embodiment.

FIG. 12 is a schematic top view of a moving body including the lidar device according to the third embodiment.

A moving body according to the embodiment may be a vehicle as illustrated in FIG. 12. The vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices. The moving body may be a flying body such as a drone or a robot such as an Automatic Guided Vehicle (AGV).

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region also can be measured by, for example, SIMS (secondary ion mass spectrometry).

According to embodiments described above, the reliability of the light detector can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light detectors such as first semiconductor layers, second semiconductor layers, first regions, second regions, insulating regions, quenching parts, insulating layers, first layers, lenses, first members, filter layers, electrodes, conductive parts, interconnects, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light detectors, light detection systems, lidar devices, and moving bodies practicable by an appropriate design modification by one skilled in the art based on the light detectors, the light detection systems, the lidar devices, and the moving bodies described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:
a first semiconductor layer of a first conductivity type;
a first region provided on a portion of the first semiconductor layer, the first region including
a first semiconductor region of the first conductivity type having a higher first-conductivity-type impurity concentration than the first semiconductor layer, and
a second semiconductor region provided on the first semiconductor region, the second semiconductor region being of a second conductivity type;
a quenching part electrically connected to the second semiconductor region;
a second region provided on another portion of the first semiconductor layer, the second region including
a third semiconductor region of the second conductivity type, and
a fourth semiconductor region provided on a portion of the third semiconductor region, the fourth semiconductor region being of the first conductivity type; and
a first layer provided on the second region, the first layer including a resin that absorbs or reflects light.

2. The detector according to claim 1, further comprising:
a first member provided on the first layer,
the first member being light-transmissive.

3. The detector according to claim 2, further comprising:
a filter layer provided on the first member or between the first layer and the first member,
the filter layer absorbing or reflecting light.

4. The detector according to claim 3, wherein
a transmittance of the first layer for light of a wavelength in a first range is less than a transmittance of the first layer for light of a wavelength in a second range, and
a transmittance of the filter layer for light of a wavelength in the first range is greater than a transmittance of the filter layer for light of a wavelength in the second range.

5. The detector according to claim 2, further comprising:
a first filter layer provided on the first member; and
a second filter layer provided between the first layer and the first member,
a transmittance of the first layer for light of a wavelength in a first range being less than a transmittance of the first layer for light of a wavelength in a second range,
transmittances of the first and second filter layers for light of a wavelength in the first range being greater than transmittances of the first and second filter layers for light of a wavelength in the second range.

6. The detector according to claim 2, further comprising:
a lens provided between the first region and the first member,
an upper surface of the lens being curved in a convex shape.

7. The detector according to claim 6, wherein
the lens is a microlens or a lenticular lens.

8. A light detector, comprising:
a first semiconductor layer of a first conductivity type;
a first region provided on a portion of the first semiconductor layer, the first region including
    a first semiconductor region of the first conductivity type having a higher first-conductivity-type impurity concentration than the first semiconductor layer, and
    a second semiconductor region provided on the first semiconductor region, the second semiconductor region being of a second conductivity type;
a quenching part electrically connected to the second semiconductor region;
a second region provided on another portion of the first semiconductor layer, the second region including
    a third semiconductor region of the second conductivity type, and
    a fourth semiconductor region provided on a portion of the third semiconductor region, the fourth semiconductor region being of the first conductivity type; and
a filter layer provided on the second region,
a transmittance of the filter layer for light of a wavelength in a first range being greater than a transmittance of the filter layer for light of a wavelength in a second range.

9. The detector according to claim 8, wherein
the filter layer is also provided on the first region.

10. The detector according to claim 8, further comprising:
a first layer provided between the second region and the filter layer,
the first layer including a resin or a metal,
the first layer absorbing or reflecting light.

11. The detector according to claim 1, further comprising:
a first electrode provided under the first semiconductor layer;
a conductive part surrounded with the first semiconductor layer with an insulating layer interposed; and
a second electrode provided under the conductive part,
the second electrode being separated from the first electrode.

12. The detector according to claim 11, wherein
the conductive part is electrically connected to the second semiconductor region.

13. The detector according to claim 1, wherein
a plurality of the first regions is arranged in a second direction and a third direction,
the second direction crosses a first direction from the first semiconductor region toward the second semiconductor region,
the third direction crosses a plane along the first and second directions, and
at least a portion of the second region is between adjacent first regions of the plurality of first regions.

14. The detector according to claim 13, further comprising:
an insulating region provided around the plurality of first regions in the second and third directions.

15. The detector according to claim 1, comprising:
a cell array part including the plurality of first regions; and
a control circuit part including the second region.

16. The detector according to claim 1, wherein
the first region includes an avalanche photodiode operating in a Geiger mode.

17. A light detector, comprising:
a first semiconductor layer;
a cell array part provided on a portion of the first semiconductor layer, the cell array part including a plurality of photodiodes;
a plurality of quenching parts electrically connected respectively to the plurality of photodiodes;
a control circuit part provided on another portion of the first semiconductor layer; and
a light-absorbing layer provided on the control circuit part,
the control circuit part including a control element that selects a portion of the plurality of photodiodes,
the light detector being of a mixed-circuit-type.

18. A light detection system, comprising:
the light detector according to claim 1; and
a distance measuring circuit calculating a time-of-flight of light from an output signal of the light detector.

19. A lidar device, comprising:
a light source irradiating light on an object; and
the light detection system according to claim 18 detecting light reflected by the object.

20. The device according to claim 19, further comprising:
an image recognition system generating a three-dimensional image based on an arrangement relationship of the light source and the light detector.

21. A moving body, comprising:
the lidar device according to claim 19.

* * * * *